(12) United States Patent
Boukherroub et al.

(10) Patent No.: US 7,332,441 B2
(45) Date of Patent: Feb. 19, 2008

(54) PASSIVATION OF POROUS SEMICONDUCTORS

(75) Inventors: Rabah Boukherroub, Ottawa (CA); Danial D. M. Wayner, Ottawa (CA); David J. Lockwood, Vanier (CA); Sylvie Morin, Toronto (CA)

(73) Assignee: National Research Council of Canada, Ottawa, ON (CA)

( * ) Notice: Subject to any disclaimer, the term of this patent is extended or adjusted under 35 U.S.C. 154(b) by 277 days.

(21) Appl. No.: 10/830,035

(22) Filed: Apr. 23, 2004

(65) Prior Publication Data

US 2004/0198054 A1    Oct. 7, 2004

Related U.S. Application Data

(62) Division of application No. 09/803,044, filed on Mar. 12, 2001, now Pat. No. 6,815,162.

(51) Int. Cl.
*H01L 21/302* (2006.01)
*H01L 21/461* (2006.01)

(52) U.S. Cl. .............. 438/745; 438/690; 438/780; 423/348; 423/324

(58) Field of Classification Search .......... 438/745, 438/690, 780; 423/348, 324
See application file for complete search history.

(56) References Cited

U.S. PATENT DOCUMENTS 5,932,493 A * 8/1999 Akatsu et al. .............. 438/745

6,284,671 B1 * 9/2001 Schmuki et al. ............ 438/745
2002/0158256 A1 * 10/2002 Yamada et al. ............. 257/79

OTHER PUBLICATIONS

Sieval et al. "Highly stable Si-C linked functionalized monolayers on the silicon (100) surface", Langmuir, 1998, vol. 14, No. 7, pp. 1759-1768.*
Effenberger et al. "Photoactivated preparation and patterning of self-assembled monolayers with 1-alkenes and aldehydes on silicon hydride surfaces" Angew. Chem. Int. Ed. 1998, 37, No. 18, pp. 2462-2464.*
J. Buriak (Chemical Communications, 1999, pp. 1051-1060).*
Sieval, A. B., et al., "Highly stable Si-C linked functionalized monolayers on the silicon (100) surface", 1998, vol. 14, No. 7, pp. 1759-1768.
Bateman, James E., et al., "Alkylation of porous silicon by direct reaction with alkenes and alkynes", Angew. Chem. Int. Ed., 1998, 37, vol. 19, pp. 2683-2685.

* cited by examiner

*Primary Examiner*—Nadine Norton
*Assistant Examiner*—Mahmoud Dahimene
(74) *Attorney, Agent, or Firm*—Richard J. Mitchell; Marks & Clerk (57) ABSTRACT

A method is disclosed for stabilizing porous silicon. A porous silicon structure having a surface terminated with hydrogen atoms is subjected to organic thermal processing to substitute the hydrogen atoms with a protective organic layer. The resulting structures are found to have unprecedented stability.

25 Claims, 12 Drawing Sheets

PASSIVATION OF POROUS SEMICONDUCTORS

CROSS-REFERENCE TO RELATED APPLICATION

This application is a divisional application under 35 USC 121 of U.S. application Ser. No. 09/803,044, filed Mar. 12, 2001 now U.S. Pat. No. 6,815,162.

FIELD OF THE INVENTION

This invention relates to the field of porous semiconductors, and in particular to porous silicon. More particularly, it relates to a method of stabilizing H-terminated porous silicon.

BACKGROUND OF THE INVENTION

Since the first report on the efficient visible photoluminescence of porous silicon (PSi) under (ultra violet) UV excitation, at room temperature, this material has generated world wide interest. There has been a vast amount of work devoted to the structural, optical and electronic aspects of this material in order to understand the origins of the photoluminescence and to develop applications in solid-state electroluminescent devices. Because of its tunable electroluminescent and photoluminescent properties, applications in silicon-based optoelectronics, which have hitherto been severely constrained by the weak luminescence of indirect band-gap bulk silicon, have become feasible. The origin of the quantum confined photoluminescence is believed to be due to the Si nanocrystallites present in the porous layer. Several models have been proposed to explain the photoluminescence contributions from other species on the PSi surface. Potential applications based on electrical and/or optical measurements for sensing chemical and biochemical species have been demonstrated using PSi.

It is found, however, that a freshly-prepared PSi surface is covered with a monolayer of hydrogen (Si—$H_x$). The hydrogen-passivated PSi film is of good electronic quality, but the monolayer of hydrogen formed on its surface does not protect against photoluminescence quenching from chemical adsorbates leading to slow degradation of photoluminescence exposure to air and concomitant degradation of the electronic properties of the material. This limitation restricts the use of PSi in the fabrication of commercial devices. The hydrogen-terminated PSi surface reacts in ambient air to form an oxide sub-monolayer, which introduces the surface defects responsible for the photoluminescence quenching. Many efforts have been made to stabilize the H-terminated surface in order to protect the PSi from photoluminescence fatigue. Deliberate oxidation of the surface is one of the most studied reactions to achieve this goal, under thermal, electrochemical, or chemical conditions. Under controlled conditions, thermal oxidation provides good results in preserving a red surface-related photoluminescence and a light-emitting device based on thermally-oxidized PSi was recently reported. However, passivation of the PSi surface by oxidation restricts the photoluminescence to red wavelengths, and is not suitable for stabilizing the photoluminescence of high porosity PSi. For example, blue photoluminescent PSi tends to react quickly with oxygen upon exposure to ambient air and the photoluminescence shifts after only a few seconds to the red. Recently, it has been found that etching of silicon single crystals in a mixture of hydrofluoric acid and ferric nitrate aqueous solution leads to a stable red photoluminescent PSi. This effective passivation is attributed to the presence of Si—Fe bonds on the PSi surface. However, the presence of metals such as iron on the semiconductor surface may severely limit the use of PSi in advanced semiconductor technology.

More recently, there has been increasing interest in the chemical modification of silicon surfaces. This strategy has been used successfully in the passivation of flat and porous silicon surfaces, and in the preparation of organic monolayers chemically stable in different organic and aqueous media. Advantages associated with these transformations include: the existence of a wide range of chemical functionalities compatible with the Si—H bonds terminating the PSi surface, the ease of carrying out the chemical reactions, and finally, the very well established organosilicon chemistry in solution. Scaling down to the molecular level will open new opportunities for a new generation of devices.

Both the formation of Si—O—C and Si—C linkages on PSi have been studied. Formation of organic monolayers containing Si—OR linkages has been achieved by photoelectrochemical reaction with carboxylic acids, and electrochemical and thermal reaction with alcohols of freshly prepared PSi surfaces. Stabilization of the PSi surface through Si—C linkages has been achieved by a direct reaction of hydrogen-terminated PSi surfaces with alkyl Grignards and lithium reagents under electrochemical and thermalconditions. In the latter case, the reaction occurs with Si—Si bond cleavage to give Si—C and Si—M (M=Mg, Li) bonds. The latter intermediate could be functionalized with different electrophiles. Hydrosilylation of hydrogen-terminated surfaces with alkenes and alkynes has been applied in the presence of a Lewis acid as a catalyst.

Such approaches are based on the substitution of H with more densely packed small molecules, such as oxygen, metals, and organic molecules. Oxygen stabilization affects the photoluminescence intensity, and the energy is fixed in the red. Metals have been found not to provide good coverage within the pores. Organic molecules have been found to provide the best results, but they still suffer from the fact that eventually oxidation occurs.

Bateman et al, *Chem Int. Ed.* 1998, 37, 2683-2685 described the application of organic molecules at elevated temperatures, but it is found that structures made by his method are partially oxidized, have poor chemical stability and poor luminescence properties.

All approaches to the problem of stabilization have so far been based on the substitution of H with more densely packed atoms or small molecules, such as oxygen, metals, and organic molecules. Oxygen stabilization affects the photoluminescence intensity, and the energy is fixed in the red. Metals have been found not to provide good coverage within the pores. Organic molecules have been found to provide the best results, but they still suffer from the fact that eventually oxidation occurs. There is, therefore, a need for an improved method of stabilization which does not suffer from the disadvantages of existing methods.

SUMMARY OF THE INVENTION

In accordance with the invention, high surface area, photoluminescent porous silicon (PSi) is chemically modified by a reaction that does not require a catalyst at a moderately elevated temperature (<250° C.), preferably 50° C.-250° C., and more preferably 85° C.-115° C. with alkenes (RCH=$CH_2$) or aldehydes (RCHO) to give organic monolayers covalently bonded to the surface through Si—C and Si—O—C linkages respectively. Such monolayers have a thickness about equal to the length of the molecules. However, any unsaturated group (RCH=X or R$^1$R$^2$C=X X=CH$_2$, O, NR', S) or nucleophilic center (RNu, Nu=OH, NHR', SH, COOH) has the potential to react under similar conditions and may be employed in the invention under suitable conditions.

In order to achieve stability it has been found that the reactants must be carefully purified before use, preferably by distillation. Also, to prevent loss of stability it has been observed that the length of the carbon chains should not be less than about 8.

Accordingly the present invention provides a method of stabilizing porous silicon comprising the steps of preparing a porous silicon structure having a surface terminated with hydrogen atoms; and subjecting said porous silicon structure to organic thermal processing with reactants selected from the group consisting of any unsaturated group (RCH=X, X=CH$_2$, O, NR', S) or nucleophilic center (RNu, Nu=OH, NHR', SH, COOH), and preferably alkenes or aldehydes, to substitute said hydrogen atoms with a protective organic layer, and wherein the reactants are purified to free them of peroxide and hydroperoxide impurities prior to said thermal processing and the length of the carbon chains in the reactants is greater than or equal to 8.

The surfaces are thermally reactive over a temperature range from 50° C. to approximately 250° C. Above 250° C. the passivating films degrade.

The resulting monolayers are characterized using diffuse reflectance infrared Fourier-transform (DRIFT), transmission FTIR, Raman, X-ray photoelectron and Auger spectroscopies. Auger depth profiling results are consistent with homogeneous incorporation of organic molecules on the internal surface of the PSi. The functionalized surfaces demonstrate surprisingly high chemical stability in boiling aqueous and organic solvents and even in more harsh environments such as aqueous HF or KOH. Ageing in ambient air for several months has no effect on the photoluminescence intensity or energy. Notably, when the surfaces were treated at 100 percent humidity at 70° C. for 6 weeks only a small increase in the photoluminescence intensity was observed. This severe treatment completely H-terminated PSi into a transparent oxide layer. This result is consistent with the formation of organic films with a very low defect density at the interface. Thus these organic monolayers have unprecedented stability and ideally passivate the PSi.

If used without purification it is found that the reactants react at much lower temperatures due to the decomposition of peroxide and hydroperoxide impurities. The inventors have made the unexpected discovery that the non-catalytic thermally-induced hydrosilylation of PSi surfaces with alkenes and aldehydes can result in highly stable structures. Passivated silicon made in accordance with the teachings of the invention has been shown to produce stable electroluminescence for more than 6 hours. The methods in accordance with the invention are believed to be capable of stabilizing blue and green luminescent porous silicon. Generally, the prior art methods have been found to degrade the surface of the silicon so that only red luminescence is possible.

The modified silicon in accordance with the invention can include molecular recognition sites. Such sites are described in co-pending US application entitled "Functionalized silicon surfaces and their method for production" R. Boukherroub, J. C. Wojtyk and D. D. M. Wayner, filed Nov. 20, 2000. This application describes only the method to include molecular recognition sites) at the end of the passivating molecule which would alter the electronic and/or photonic properties of the porous silicon. This has the potential to lead to revolutionary devices for genomics and proteomics applications. Genomics involves the parallel analysis of complex mixtures of DNA. Proteomics involves the parallel analysis of complex mixtures of proteins.

BRIEF DESCRIPTION OF THE DRAWINGS

The invention will now be described in more detail, by way of example only, with reference to the accompanying drawings, in which.

DETAILED DESCRIPTION OF THE PREFERRED EMBODIMENTS

In accordance with the principles of the invention, porous silicon is subject to organic thermal processing with aldehydes which are carefully purified to remove peroxide and hydroperoxide impurities. Suitable aldehydes include octyl and decyl aldehydes. The reaction is carried out in the absence of an external catalyst although it is possible that some degree of autocatalytic reaction may occur from the reaction products.

The protective organic layer generally has a thickness equal to or less than the length of the organic molecules in the reactants.

The length of the carbon chain should be not less than about 8 since otherwise loss of stability occurs in the finished product. This results in hydrosilylation of hydrogen-terminated PSi surfaces. In the case of hydrosilylation with 1-decene and with octanal and decanal the reaction takes place respectively at 115° C. and 85° C. to give organic monolayers covalently-attached to the surface through Si—C and Si—O—C bonds (scheme I).

Scheme I

EXAMPLE

Silicon wafers were purchased from Virginia semiconductor. All cleaning and etching reagents were clean room grade (Olin Microelectronics Materials). All other reagents were obtained from Aldrich and were the highest purity available.

Single side polished (100) oriented p-type silicon wafers (B-doped, 1-1.05 ohm-cm resistivity) were first cleaned in 3:1 concentrated $H_2SO_4$/30% $H_2O_2$ for 5 min at room temperature and then rinsed copiously with Milli-Q water. The clean wafers were immersed in 48% aqueous HF solution for 1 min at room temperature to remove the native-oxide. The hydrogen-terminated surfaces were electrochemically etched in a 1:1 (v/v) pure ethanol and 48% aqueous HF for 8 min at a current density of 5 mA/cm$^2$. After etching, the samples were rinsed with pure ethanol and dried under a stream of dry nitrogen prior to use. Atomic force microscopy (AFM) in contact mode showed that PSi films prepared in this way are 2.5 to 3 μm thick with an average pore diameter of ca. 7 nm.

The freshly prepared PSi surface was placed under argon in a Schlenk tube containing a deoxygenated neat 1-decene or aldehyde and allowed to react at 115° C. or 85° C., respectively, for 16 hours. The excess of unreacted and physisorbed reagent was removed by rinsing, at room temperature, with tetrahydrofuran and 1,1,1-trichloroethane and then the sample was dried under a stream of nitrogen.

The resulting samples were then aged by exposure to 100 percent humidity air at 70° C. A simple apparatus was constructed in which a stream of argon was passed through boiling MilliQ water and carried to the sample in a Soxhlet extractor above the boiling water. The temperature in the extractor was measured to be 70° C. The samples were then subjected to various analysis procedures.

Figure 1:
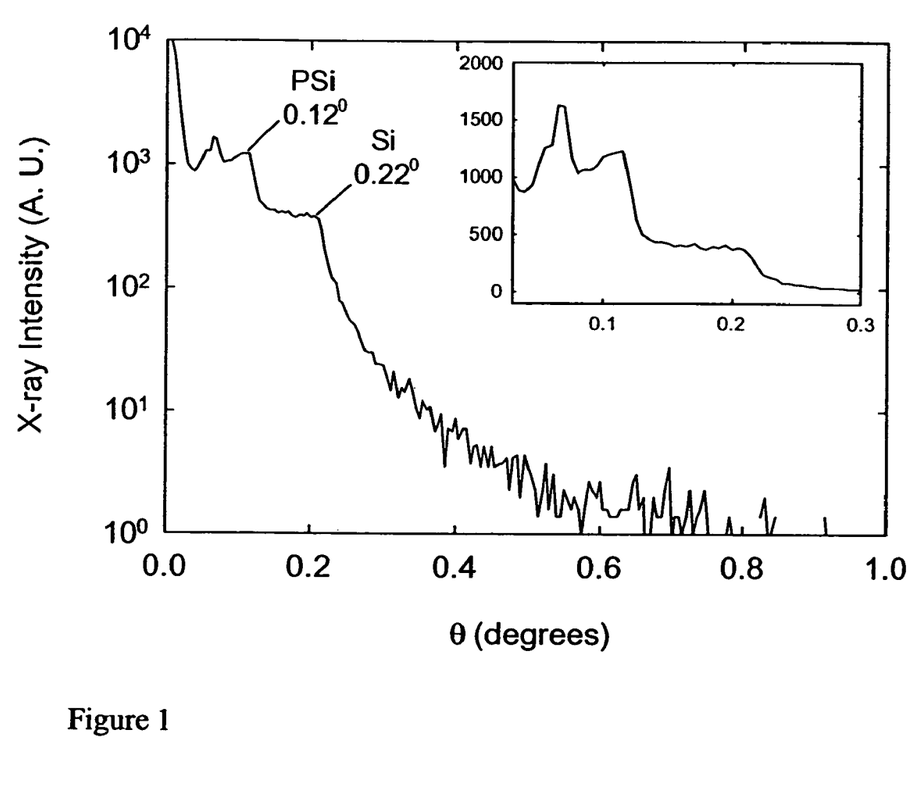
FIG. 1 shows the X-ray reflectivity response for freshly prepared and H-terminated PSi at room temperature.
Figure 2:
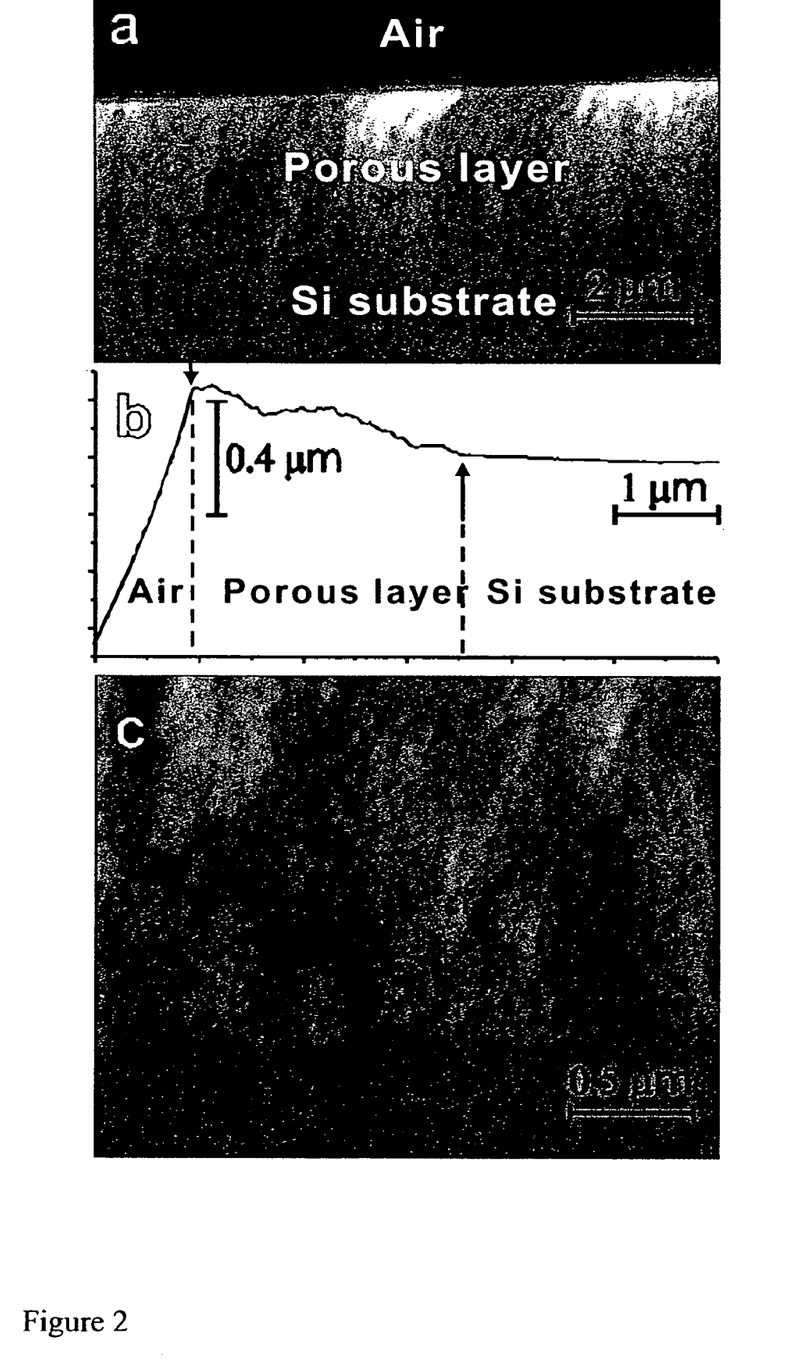
FIG. 2 shows the contact mode AFM image of the cross-section of a PSi layer (a) 10×6 μm$^2$; (b) line scan obtained from the central part of (a) for the height as a function of the length of the image (i.e., 6 μm), the three regions are indicated as well as the position of the interfaces (see arrows); and (c) detail of the porous layer/Si substrate interface, 2.5×2.0 μm$^2$.

Characteristic cross-sectional images of the PSi samples using contact mode AFM (Atomic Force Microscopy) are shown in FIG. 2. The PSi layer shown was obtained after 8 min etching at a current density of 5 mA.cm$^{-2}$ in HF/EtOH=1:1 (v/v) at room temperature. Three regions are visible in FIG. 2a. The Si substrate appears at the bottom of the image as the very smooth gray surface. The PSi layer is the roughened surface in the central part of the image. Beyond the PSi/air interface (black region at the top of the image) the tip begins to fall off the sample. The position of the PSi/air layer interface is seen clearly from a line scan passing through the three regions of the image (see FIG. 2b). The gradual drop-off beyond the PSi/air interface is due to continued contact with the edge of the pyramidal tip. From this image the average thickness of the PSi layer is 2.6±0.06 μm.

By scanning over a smaller area that encompasses the porous layer/Si substrate interface, the granular structure of the PSi layer is evident (FIG. 2c). On this scale, these structures (50±20 nm dia.) appear to be evenly distributed. When the tip is very close to the edge (not shown) it is more difficult to image the sample without interference from the PSi/air interface and it is thus more difficult to comment on the homogeneity of the crystallite size distribution in that region. Hence, one cannot rule out the possibility of a small porosity gradient near this interface. The PSi layer is clearly mesoporous, as often observed for Si etched in dilute aqueous HF or ethanolic HF (pore size smaller than 50 nm).[2]

Figure 3:
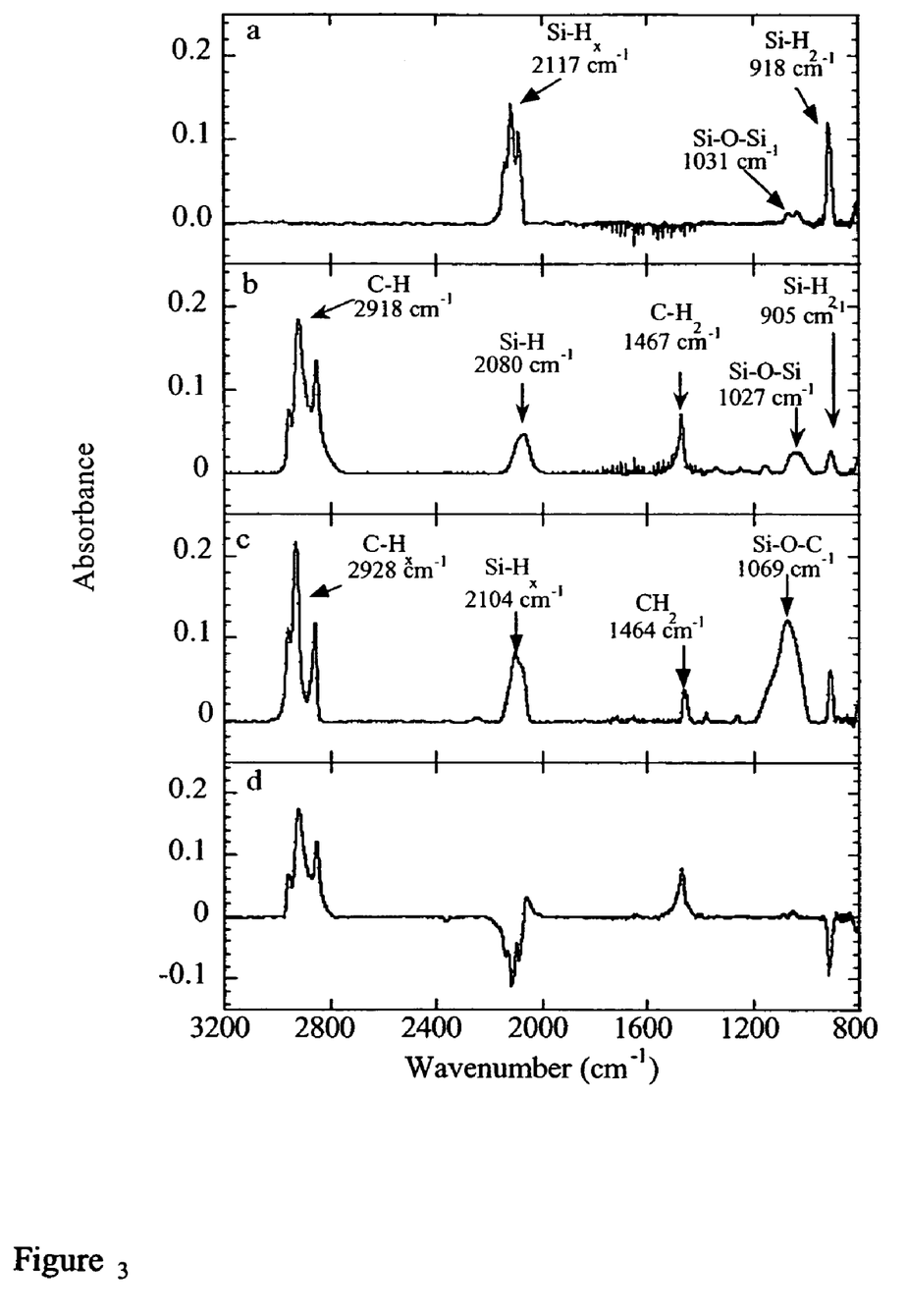
FIG. 3 shows the diffuse reflectance infrared Fourier-transform spectra for a) freshly prepared PSi before functionalization and PSi derivatized with b) 1-decene and c) decylaldehyde, and d) difference DRIFTS spectrum of (b)-(a).

A DRIFT or transmission FTIR spectrum of freshly prepared PSi (FIG. 3a) exhibits absorptions for the Si—H$_x$ stretches modes (2088 cm$^{-1}$ for $\nu_{Si-H_1}$, 2117 cm$^{-1}$ for $\nu_{Si-H_2}$, and 2138 cm$^{-1}$ for $\nu_{Si-H_3}$), the Si—H$_2$ scissor mode (918 cm$^{-1}$) and the Si—O—Si stretch (due to interstitial oxygen in the original silicon substrate lattice, 1031 cm$^{-1}$). After reaction of the PSi with 1-decene at 115° C. (FIG. 3b) or decanal at 85° C. (FIG. 3c) for 16 hours, additional peaks at 2857-2960 cm$^{-1}$ (C—H stretching modes of the alkyl chain) and at 1470 cm$^{-1}$ (methylene bending modes) appear.

The absorption intensity of $\nu_{Si-H_x}$ and $\delta_{Si-H_2}$ decreases substantially after the reaction indicating that most of the hydrogen has reacted with the unsaturated C=C and C=O double bonds (FIG. 3d). This result is consistent with a hydrosilylation reaction that preferentially consumes the more reactive SiH$_3$ and SiH$_2$ species (negative bands for the SiH$_x$ stretch modes around 2117 cm$^{-1}$ and the Si—H$_2$ scissors mode at 915 cm$^{-1}$). The DRIFT spectrum also indicates the presence of unreacted silicon-hydrogen bonds SiH$_1$ (2063 cm$^{-1}$) after the thermal modification of the PSi surfaces. Reaction for longer times does not increase the coverage, which appears to be limited by the steric hindrance introduced by the organic molecules on the surface.

The efficiency of the reaction as determined by the fraction of SiH$_x$ stretch that disappears is 30-50 percent depending on the method of preparation of the PSi. What was unexpected was that lower apparent conversions were obtained when the vibrational spectroscopic analysis was carried out using transmission FTIR on samples etched at low current densities (5 mA/cm$^2$, 3 μm thick) compared to DRIFT. However, for samples etched at higher current densities (>100 mA/cm$^2$, 3 µm thick) there is good agreement between the two methods. Furthermore, there is good agreement between the two methods for samples etched at 5 mA/cm$^2$ to a thickness of 1 µm. The reasons for the discrepancy in the low current density samples is not completely understood. In general there are two factors which complicate the DRIFT analyses. The first is that the film thickness used in this study (ca. 3 µm) leads to interference fringes which are about 100 times the peak width leading to significant errors in baseline correction for absorption peaks on the rising or falling edges. The second is that the chemical modification significantly alters the optical properties of the film so the as anodized film cannot be used to subtract out the interference fringes. The much higher frequency interference fringes in transmission measurements are easily filtered out the spectrum. For the entire range of samples studied, transmission FTIR gives the most consistent and reliable data.

In all cases the inventors found that the modification took place without measurable oxidation of the surface as indicated by the peak at 1031 cm$^{-1}$ which does not increase in contrast to the prior art, particularly as reported by Bateman et al. The modification of the surface is accompanied by a decrease of the intensity and a broadening of the Si—H$_x$ band. The broadening effect is likely related to the interactions of the unreacted Si—H$_x$ with the organic molecules attached to the surface. Such a broadening effect has been reported for organic physisorbed molecules on hydrogen-terminated Si (111). A similar infrared spectrum was obtained when the as-anodized PSi sample was allowed to react with decyl aldehyde at 85° C. for 16 hours, with an additional peak appearing at 1069 cm$^{-1}$ that is consistent with the formation of Si—O—C bonds (FIG. 3c).

X-ray photoelectron spectroscopy (XPS) was used to analyze the elemental composition of the PSi surfaces and the nature of the chemical bonding of the organic molecules on the surface. An XP survey spectrum of the as-anodized PSi contains small peaks at a binding energy of 687 and 532 eV due to the remaining fluoride ions in the silicon pores and the interstitial oxygen in the silicon lattice, and an intense signal at 99 eV due to silicon (FIG. 4a).

Figure 4:
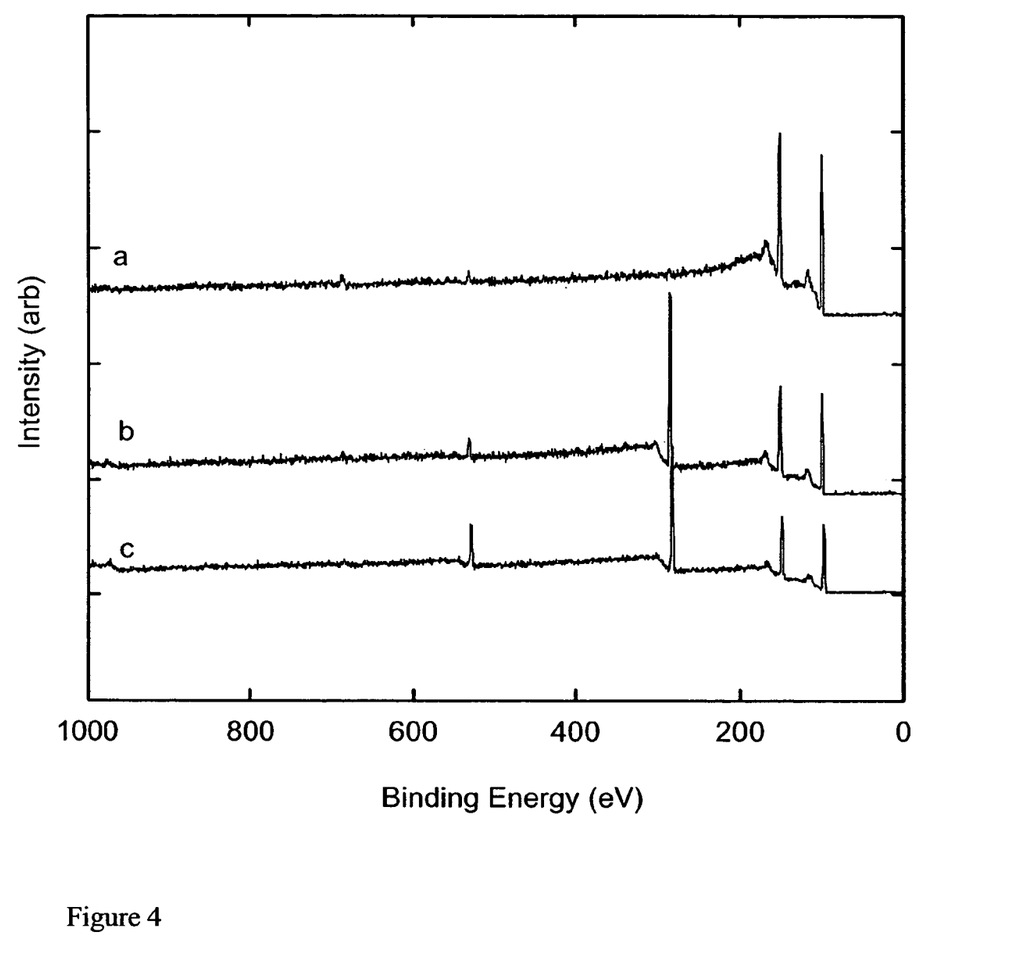
FIG. 4 is an XPS survey of freshly prepared PSi substrate (a), and thermally-modified PSi samples with (b) 1-decene and (c) decanal.
Figure 5:
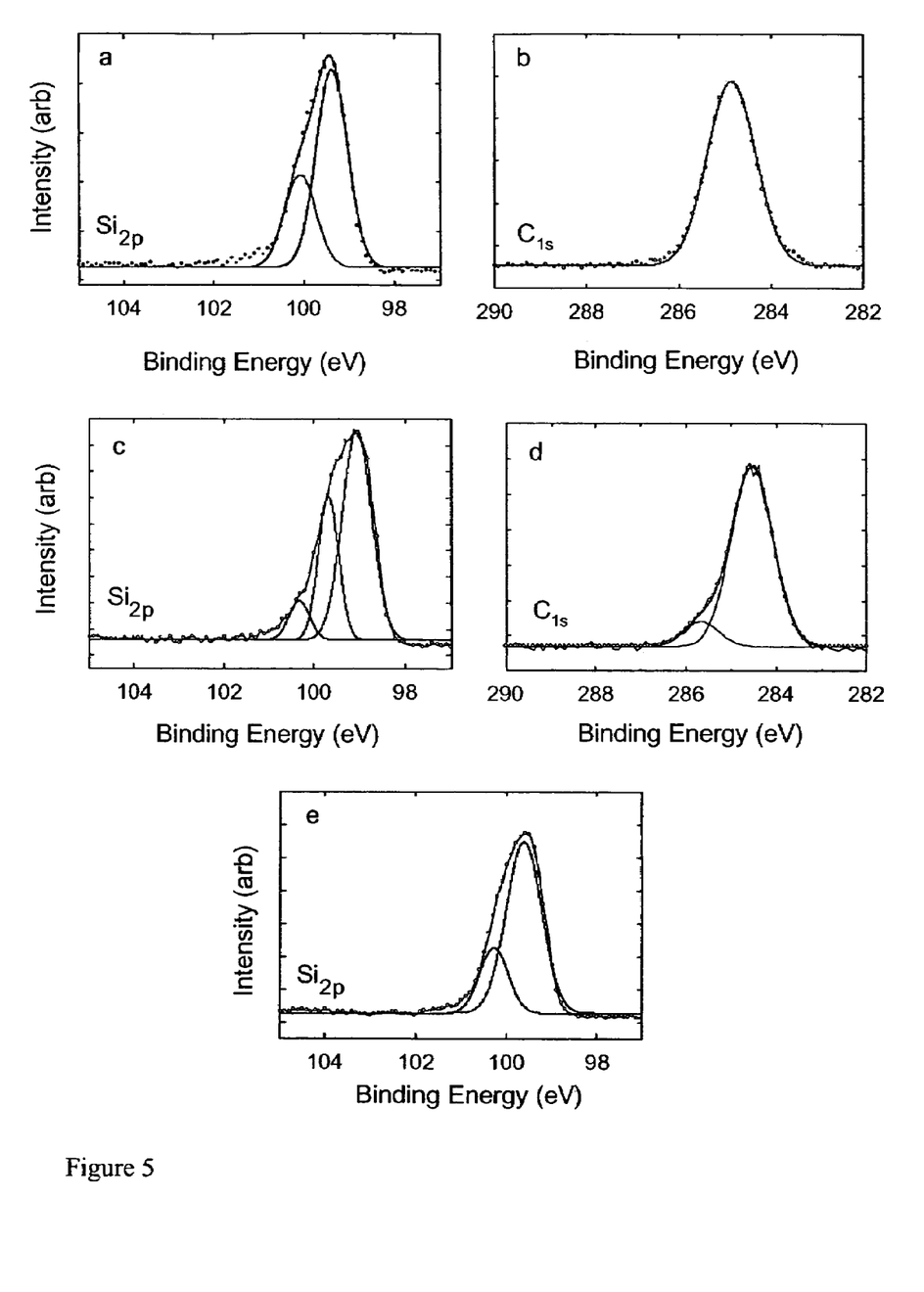
FIG. 5 shows high resolution XPS spectra of the Si$_{2p}$ (left) and C$_{1s}$ (right) regions of PSi surfaces prepared by the thermal reaction of H-terminated PSi with 1-decene (a), and decyl aldehyde (b). Si$_{2p}$ of the as-anodized PSi is shown in (e).

FIG. 4b exhibits an XPS survey of the modified surface with 1-decene. The oxygen signal at 532 eV does not increase significantly. However, as expected, a new peak at 285 eV arising from C$_{1s}$ of the alkyl chain appears. High resolution XP spectra of Si$_{2p}$ and C$_{1s}$ (FIGS. 5a and b) of the decyl-terminated surface are consistent with the formation of an Si—C bond. The Si$_{2p}$ is comparable to that from a hydrogen terminated surface (FIG. 5d). The small oxygen peak in the survey spectrum is not associated with surface oxidation (SiO$_2$) which would appear as a chemically shifted peak near 103 eV at high resolution.

The Si and C peaks in the XP spectrum of the decanal modified PSi are similar to the decene modified surface. In addition, the expected increase of the oxygen signal due to the Si—O—C link is observed. (FIG. 4c). High resolution XP spectra are characterized by chemically shifted C$_{1s}$ and Si$_{2p}$ peaks, assigned to the respective carbon-oxygen (C—O) and silicon-oxygen (Si—O—C) linkages (FIG. 5c and d). As with the decene modified surface, there is no apparent peak due to silicon oxide. This supports the conclusion that these surface transformations occur without any conventional oxidation of the silicon surface.

Figure 6:
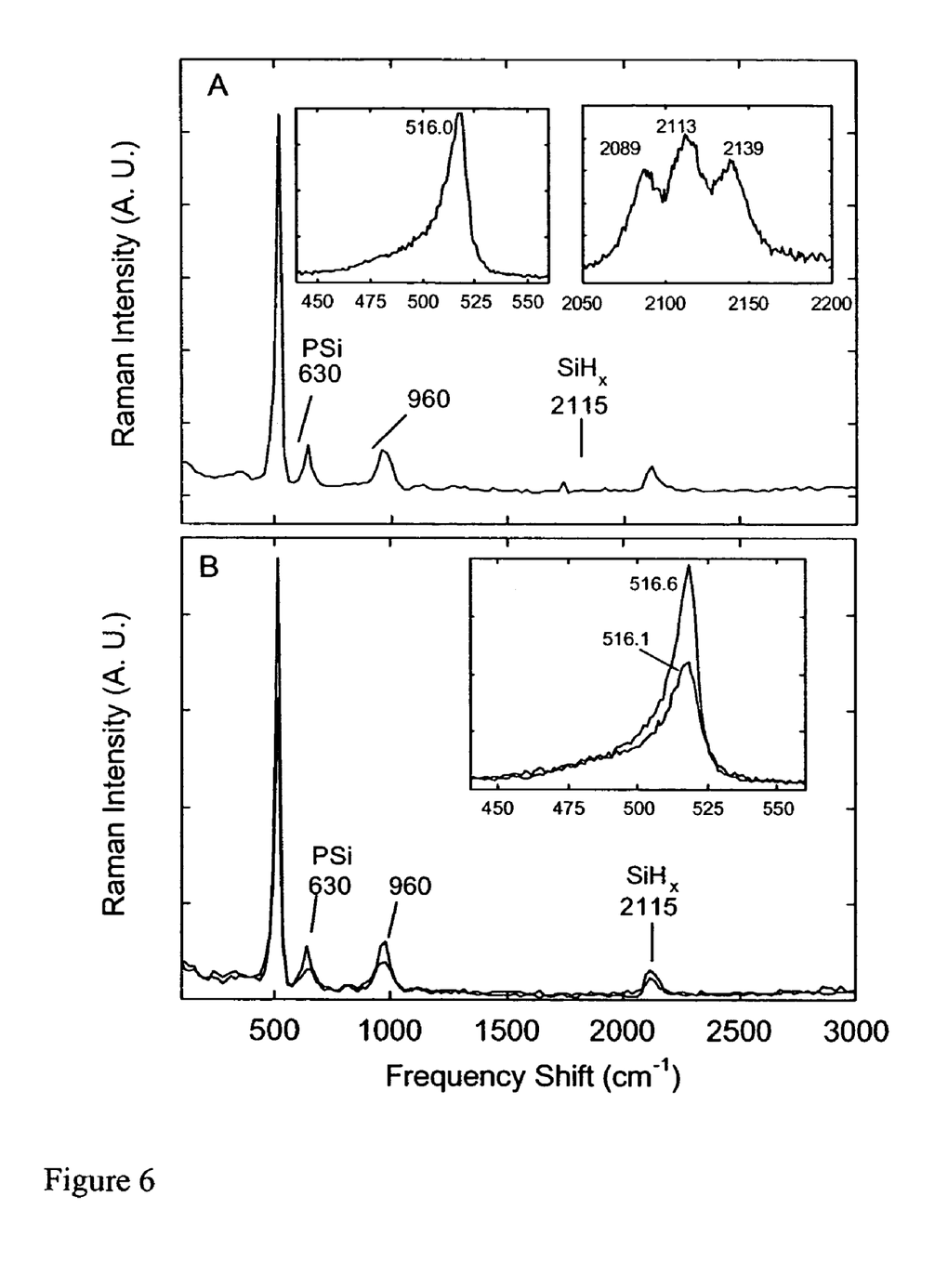
FIG. 6 shows (A) Raman spectrum of freshly prepared H-passivated PSi recorded at room temperature with a resolution of 8 cm$^{-1}$ and a step size of 20 cm$^{-1}$ and (B) Raman spectra of freshly prepared PSi at room temperature before and after passivation with 1-decene. The insets show details of the spectrum recorded with a resolution of 3 cm$^{-1}$ and step size of 1 cm$^{-1}$.

Vibrational Raman spectroscopy was used to characterize the chemical state of the various PSi samples. Like infrared spectroscopy, Raman scattering is sensitive to chemical bond formation, but has the additional advantage in this case of providing such information simultaneously with the photoluminescence measurements at the same location on the sample. The Raman spectrum of a freshly prepared sample of PSi is shown in FIG. 6A. The intense peak at 516 cm$^{-1}$, shown in detail in the inset, is due to the nanostructured PSi layer. The Raman frequency of crystalline silicon (c-Si) is 520 cm$^{-1}$, but this peak is not evident in FIG. 6A This indicates that the blue excitation light at 457.9 nm does not penetrate through the 2 µm thick PSi layer to reach the c-Si substrate. The weaker features (e.g., 630 and 960 cm$^{-1}$) at frequencies less than 1000 cm$^{-1}$ are due to second-order scattering from PSi. The peak at ~2115 cm$^{-1}$ actually comprises three bands at 2089, 2113, and 2139 cm$^{-1}$ (see inset): these corresponds to various Si—H$_x$ stretching vibrations also seen in the infrared at 2088, 2117, and 2138 cm$^{-1}$. No other Raman features were observed in any of the freshly prepared PSi samples.

The Raman frequency of 516±0.4 cm$^{-1}$ found for the porous silicon samples allows a determination of the average nanoparticle diameter. From the known dependence of the silicon Raman frequency on silicon sphere diameter, the frequency shift from 520 cm$^{-1}$ in c-Si to 516 cm$^{-1}$ in PSi indicates an average spherite diameter of 5 nm.

The Raman spectrum of a freshly prepared PSi sample before and after reacting with 1-decene is shown in FIG. 6B. The spectra are identical in feature position and lineshape, with the exception of a weak broad band appearing at 2900 cm$^{-1}$ due to the alkyl C—H vibrations. The latter sample exhibits a 30% lower Raman intensity characteristic of the coated PSi layer. The inset to FIG. 6B confirms that the PSi structure is unaffected by passivation. Similar results were obtained from Raman measurements of the modified surfaces with octyl and decyl aldehydes. The Raman spectra also show, in agreement with the DRIFTS results, that not all of the passivating H atoms are removed in the thermal activation process.

Figure 7:
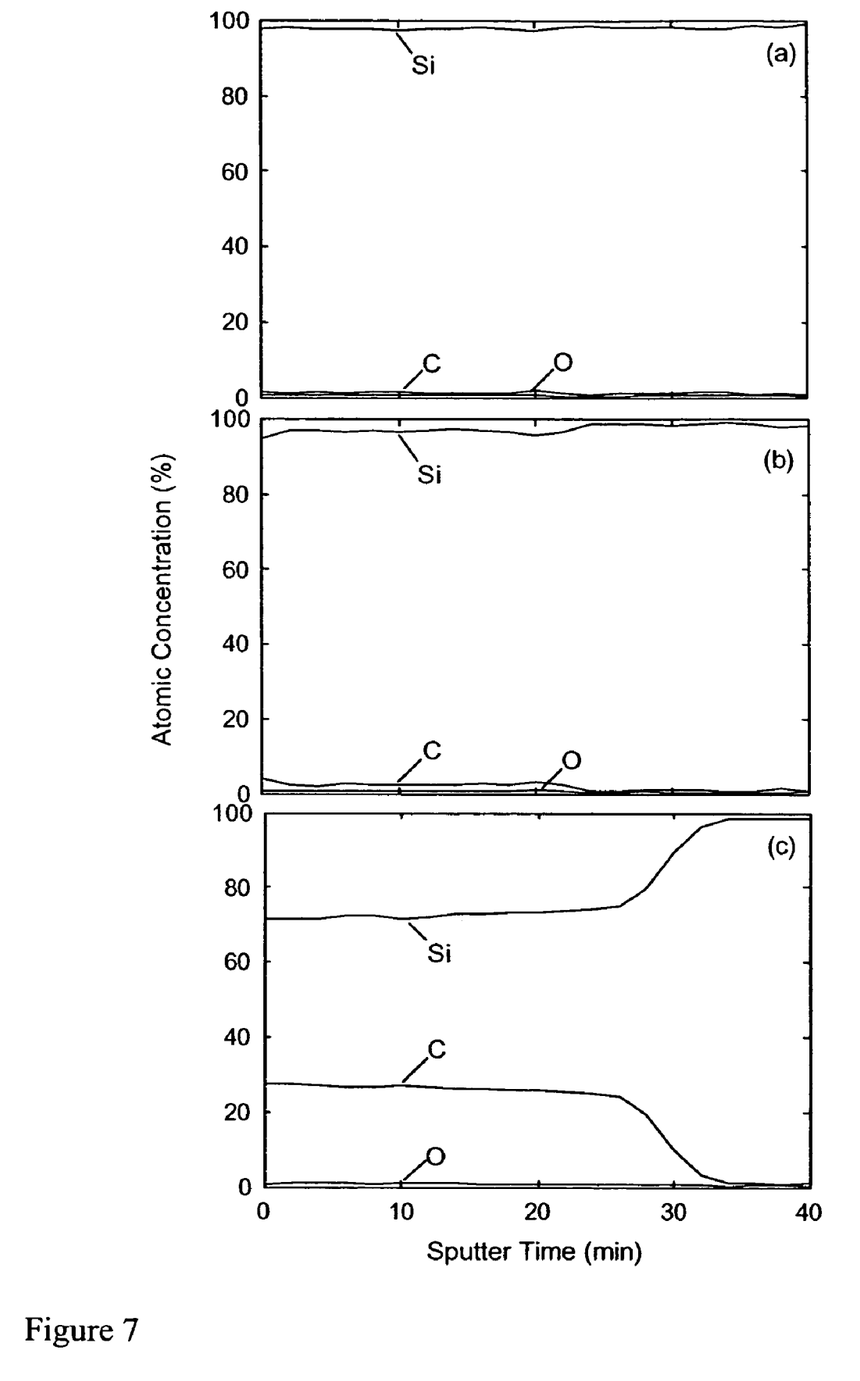
FIG. 7 shows the Auger profiles of (a) as anodized PSi, (b) as anodized PSi heated in deoxygenated decane for 22 h at 100° C., and (c) PSi modified with decene.

FIG. 7 displays Auger depth profiles of the PSi and a modified PSi surface. The as anodized surface (FIG. 7a) shows a constant atomic concentration of silicon with carbon and oxygen both below the detection limit.

As a control, the as anodized surface was heated in deoxygenated decane at 100° C. for 22 h (FIG. 7b). After this treatment there was a barely perceptible increase in the methylene absorption in the in the vibrational spectrum of the film but no measurable decrease in the Si—H absorption. The auger depth profile of this surface shows only traces of physisorbed carbon with the oxygen still below the detection limit. After modification with decene (FIG. 7c) there is a clear increase in the carbon content which is constant from the surface to the PSi/Si interface thus, showing that the pores are uniformly modified. Similar results are obtained for the aldehyde modified surface (data not shown) with the difference that there is a constant concentration of both carbon and oxygen throughout the porous region with relative concentrations consistent with elemental composition of the monolayer. The increase of the Si concentration and the abrupt disappearance of the carbon signal provides a clear measure of the PSi/Si interface.

Figure 8:
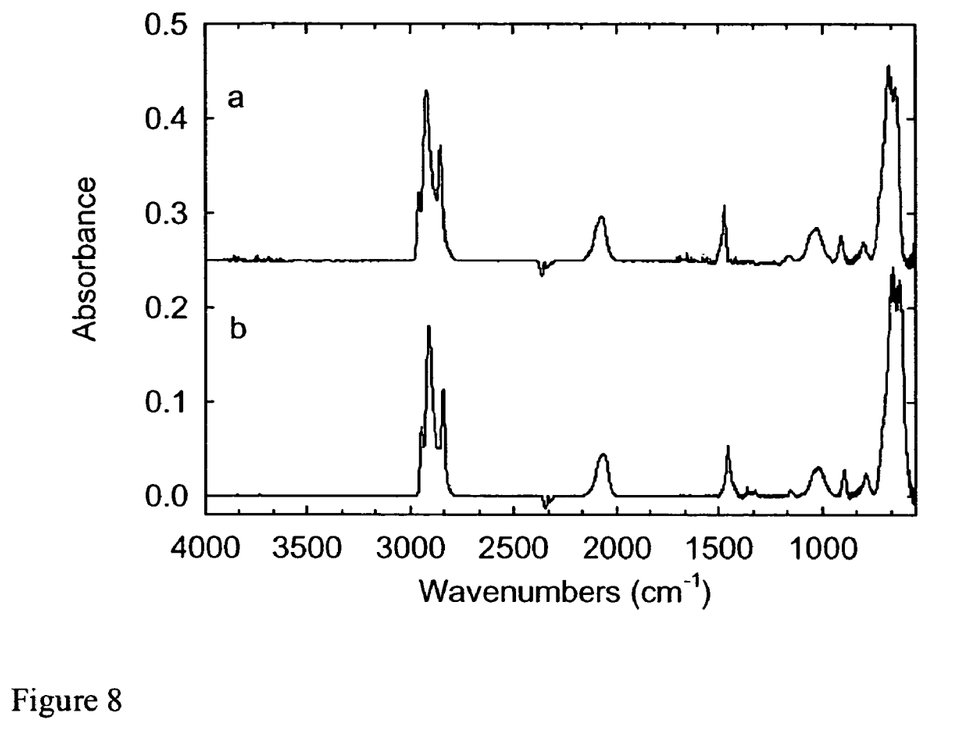
FIG. 8 shows DRIFT spectra of (a) freshly prepared decyl-terminated PSi surface and (b) the derivatized surface after the following sequential treatments: sonication in CH$_2$Cl$_2$ for 5 min; at room temperature; boiling in CHCl$_3$ for 1 hour; boiling in water for 1 hour; immersion in MilliQ water for 16 h at room temperature; immersion in 1.2 N HCl at 75° C. for 2 h; immersion in aqueous 48% HF solution for 2 h at room temperature; and immersion in 48% HF for 65 h at room temperature.

Long term passivation of the PSi requires a protecting organic layer which does not produce surface states and is chemically robust. In order to evaluate the chemical robustness of the surface derivatized with 1-decene, samples were subjected to the following sequential treatments: sonication in CH$_2$Cl$_2$ for 5 min at room temperature, boiling in CHCl$_3$ for 1 hour, boiling in water for 1 hour, immersion in MilliQ water for 16 h at room temperature, immersion in 1.2 N HCl at 75° C. for 2 h, and immersion in aqueous 48% HF solution for 65 h at room temperature. The decene modified surface was found to be extremely robust; there was no evidence for any chemical deterioration of the monolayer as evidenced by the unchanged $v_{(C-H)}$ IR intensity associated with the alkyl group (FIG. 8). After these chemical treatments there was no evidence of oxidation of the silicon surface (i.e., no increase of the v(Si—O) absorbance). The hydrophobic character of the methyl end groups of the alkyl chain and the high coverage of the surface prevents the permeation and diffusion of aqueous and organic molecules and thus ideally chemically passivate the surface. The chemical stability is not affected even in harsh environments such as aqueous HF solutions at room temperature or KOH solutions (pH 13) for several hours. The aldehyde-modified surfaces also are stable under the same conditions. This is, again, in contrast to prior art, especially that reported by Bateman et al.

The IR results show that the thermal reaction of 1-alkenes and aldehydes occurs with the consumption of Si—H bonds. This is consistent with the addition of the weak Si—H bond across the unsaturated double bond (C=X, X=O, CH$_2$) and not with the cleavage of the Si—Si bonds, as reported for the thermal reaction of PSi with alcohols, alkyl lithium, and Grignard reagents.

Figure 9:
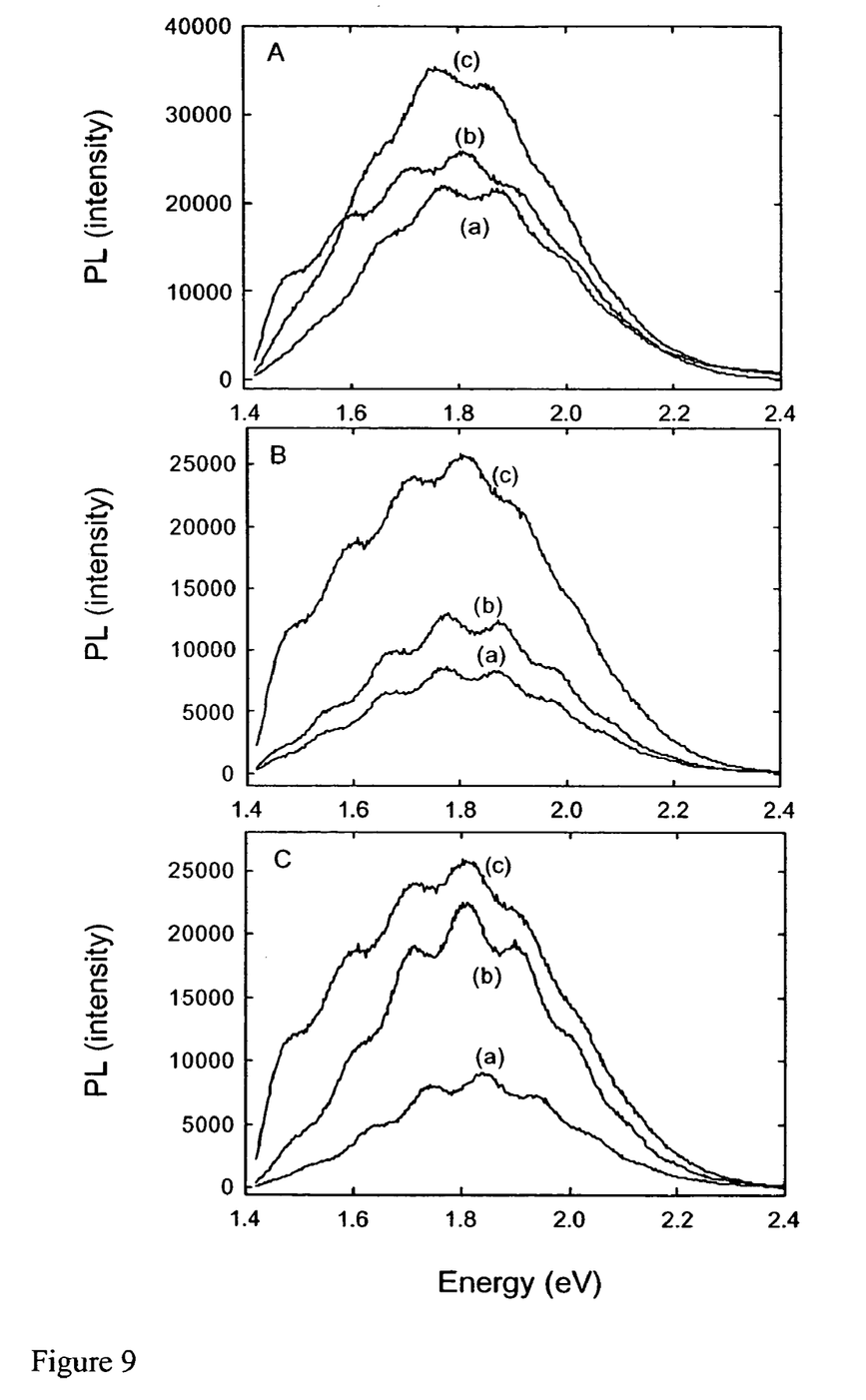
FIG. 9 shows the steady-state room temperature photoluminescence spectra of A: derivatized PSi with octyl aldehyde (a), freshly prepared PSi (b), and (a) steam treated for 3 days (c). B: freshly prepared decyl aldehyde modified PSi surface (a), as-anodized PSi (b), and (a) steam treated 3 days (c). C: freshly prepared 1-decene modified PSi surface (a), as-anodized PSi (b), and (a) steam treated 3 days (c). D: as-anodized PSi before (a), and after 6 weeks steam treatment (b). E: freshly prepared 1-decene functionalized surface before (a), and after 6 weeks steam treatment (b).

Typical photoluminescence spectra of freshly-prepared PSi before and after modification with octanal are shown in FIG. 9A. The photoluminescence intensity and the peak position were not affected by the derivatization. The functionalized sample exhibits an orange-red photoluminescence comparable to the H-terminated sample FIG. 9A (b), which is characteristic of 70 percent porosity. Aging the samples in air for several months, in the dark or exposed to day light, does not induce any change in the photoluminescence intensity or in the energy maximum. When the organic passivated substrate was exposed to 100 percent humidity air at 70° C. for 3 days (FIG. 9A (c)), there was an increase in intensity by about 40 percent. Samples modified with decanal FIG. 9B (a) showed a reduction of the photoluminescence of about 60 percent compared to a freshly etched sample (FIG. 9B (c)). Aging in ambient air does not have any effect on the photoluminescence intensity even after 2 months. Steam treatment for three days, results in an increase in the photoluminescence intensity of 35 percent (FIG. 9B (b)). Further exposure to steam has little effect on the photoluminescence intensity.

The photoluminescence spectrum of the decyl terminated surface is shown in FIG. 9C. The photoluminescence intensity is only 40 percent of the as-anodized PSi sample (FIG. 9C (c)). Aging for three days under the same conditions as for the octanal and decanal modified surfaces results in an increase in the photoluminescence intensity of only 50 percent (FIG. 9C (b)). Again, exposure to 100 percent humidity air at 70° C. for 6 weeks had a relatively small effect on the photoluminescence nor on the photoluminescence maximum. The photoluminescence intensity of the modified sample increased by about a factor of three FIG. 9D (b) compared to the original photoluminescence, measured just after chemical modification. However, the photoluminescence of the as-anodized sample had increased by a factor of 50 under the same conditions (FIG. 9E).

The reduction of the photoluminescence from the thermal reaction of decene is less than that from the catalytically modified surface in which the photoluminescence efficiency was only 25 percent of the hydrogen terminated sample. Treatment with HF resulted in partial recovery to about 50 percent of the original intensity (coincidentally the level achieved initially in the thermal reaction). Treatment with HF had no effect on the photoluminescence intensity of the modified PSi in this study. Again, and consistent with the spectroscopic evidence, this suggests that the thermal reaction provides a more effective passivating layer which tenders the silicon inaccessible by polar solvents.

Raman, DRIFT and transmission FTIR spectroscopies have been used as tools to monitor the intrinsic properties of the porous layer and to understand the aging effect on the photoluminescence intensity. For the functionalized surfaces, the Raman peak remains unchanged and shows the same features compared to the initially modified surfaces (before aging). The increase in the photoluminescence intensity is ascribed to the formation of a very small amount of oxide during the aging process (a small increase in the Si—O—Si stretching mode in the DRIFT spectrum) without any apparent loss of the organic layer.

Figure 10:
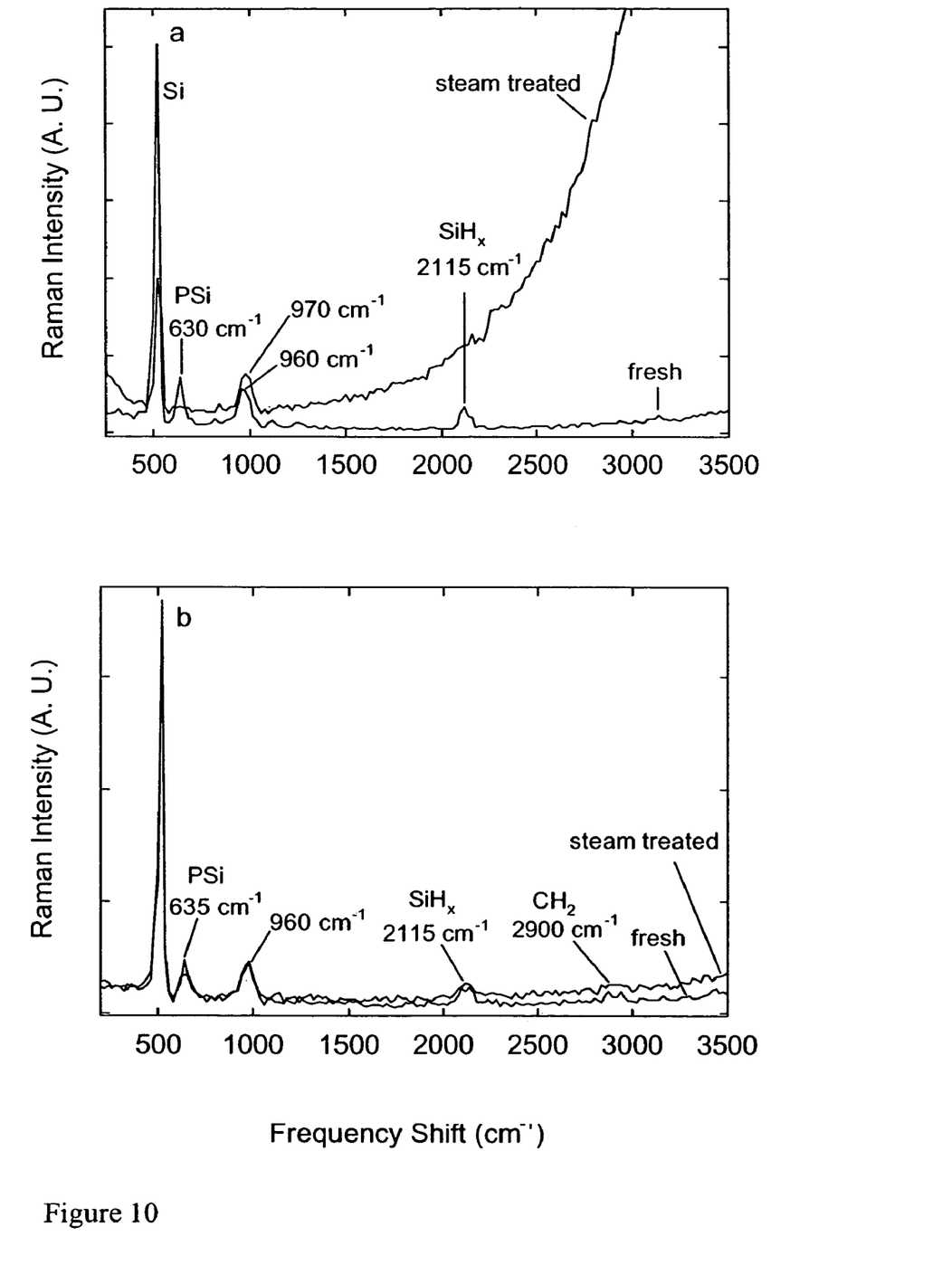
FIG. 10 shows the Raman spectra of (a) H-terminated PSi and (b) decyl-modified PSi before and after steam treatment for 6 weeks, and (c) gives details of the Si peak before and after steam treatment for 6 weeks.

Raman spectroscopy is particularly informative in understanding the effect of the aggressive steam oxidation on H-terminated porous silicon. The spectra given in FIG. 10a shows that the first and second order silicon Raman features are considerably modified after steam treatment: the 630 cm$^{-1}$ line disappears and the 516 and 960 cm$^{-1}$ lines shift up to 520 and 970 cm$^{-1}$. Also, the SiH$_x$ line at 2115 cm$^{-1}$ is no longer visible. The Si line at 520 cm$^{-1}$ is now sharp and symmetric FIG. 10b and is typical of crystalline Si. The Raman spectrum of the steam treated sample indicates that the PSi layer has been converted to SiO$_x$, which is transparent to the blue incident light. On the other hand, the Raman spectrum of the decyl-terminated sample is unchanged by the same steam treatment, as can be seen in FIG. 10c. The samples modified with octyl and decyl aldehydes behaved similarly.

DRIFT and transmission FTIR spectroscopies show that the hydrogen peak present in the H-terminated surface centered at 2117 cm$^{-1}$ was shifted to 2249 cm$^{-1}$, characteristic of [(—O—)$_3$Si—H], accompanied with an intense band at 1114 cm$^{-1}$ corresponding to the stretching mode vibration of Si—O—Si. The drastic increase in the number of Si—O—Si bonds is attributed to the formation of a transparent oxide monolayer.

These results clearly demonstrate the unprecedented and extreme stability of the modified surfaces to harsh environmental conditions and the blocking and protective effect of the organic molecules against oxidation compared to hydrogen-terminated PSi.

In another embodiment the hydrogen terminated PSi surface was thermally reacted with ethyl undecylenate at 85° C. to produce a surface bearing an ester function at the end of the Si layer.

When stored in air for several weeks, the treated surfaces did not show any apparent degradation. They are stable to 2.4 N HCl at 70° C. for several hours and only the ester hydrolysis was observed. An organic monolayer with acid terminal groups was formed during this treatment.

Recently, Canham et al. have developed a new method to monitor the degree of oxidation of the porous surface based on silver halide (present in photographic emulsion) reduction by gaseous silane, SiH$_4$, resulting from the chemical hydrolysis of the silicon-silicon backbonds. The degree of oxidation is related to the optical density of the corresponding spots formed on the photographic plates.

The samples were exposed to 100% humidity in air. After a 1 h exposure, the functionalized surface with ethyl undecylenate in the presence of TMSCl shows a light circular spot while the hydrogen terminated surface has been heavily reduced. The optical density of the spots corresponding to the modified surfaces did not show any dramatic evolution after a 4 h exposure when compared to the as-anodized surface under the same conditions. This implies that the alkyl chains of the monolayers prevent hydrolysis of the Si—Si bonds. The high density of organic molecules attached to the surface through the hydrosilylation reaction and the hydrophobic character of these chains protect well the surface from oxidation in ambient air. Amazingly, the surface modified with ethyl undecylenate containing some oxide on its surface did not show any changes after a 4 h exposure, and even after 16 h only a slight dark spot is noticeable. This is an unprecedented effect, since even when the surfaces are thermally oxidized they did not show such a strong prevention against corrosion.

The presence of small amounts of oxide formed during the chemical process, when no special precautions were taken in order to eliminate the traces of water present in the chemical reagent, increases remarkably the surface resistance against corrosion. The stability of the surface to hydrolysis is, in this case, comparable to that of thermally oxidized PSi surfaces in which the nanostructure matrix is affected by the thermal oxidation process. Such a high surface stability augers well for biomedical applications. Finally, the presence of regions of different chemical composition (oxidized regions and organic modified regions) on the surface is of interest for controlling the wetting properties of the surface. This is an important step towards applications of the PSi matrix for DNA and protein microarray processing.

The teachings of the invention permit PSi substrates to be effectively passivated by organic functionalization of the hydrogen-terminated surfaces in a thermal, non-catalytic reaction. This transformation occurs with a high chemical yield and importantly retains the intrinsic structural properties of the PSi layers. Visible photoluminescence of the as-anodized PSi was preserved and found to be very stable during an ageing process that completely destroyed underivatized surfaces. This includes exposure to 100 percent humidity at 70° C. for as much as 6 weeks. The thermal reactions provide surfaces which are more densely packed (by about a factor of two) than the corresponding surfaces modified in a catalytic process using Lewis acids. The difference between these processes is likely related to steric inhibition of the catalytic process which requires the catalyst and the reactant to be in close proximity to the surface. Thus, the thermally modified surfaces have fewer defects. A similar decrease in coverage was reported for the catalytic modification of Si(111)—H surfaces. The unprecedented high stability of the monolayers under such harsh conditions is an important step towards the development of PSi for potential photonic and sensor applications. It is expected that these modified surfaces will effectively prevent the hydrolytic corrosion of PSi layers in aqueous solutions and in simulated biological media.

The invention finds important application as sensors in the field of electronics, photonics/optoelectronics, and in chemical and bio and medical devices. The described passivation process has applications in in vivo medicine for passivating silicon or porous silicon based implants as well as for medical sensor devices. Such devices have major implications for the medical and biomedical fields.

We claim:

1. A method of stabilizing porous silicon (PSi) to protect the porous silicon from luminescence fatigue comprising the steps of:
preparing a porous silicon structure having a surface terminated with hydrogen atoms; and
subjecting said porous silicon structure to non-catalytic thermally induced hydrosilation with reactants selected from the group consisting of: RCH=X, $R^1R^2$C=X, where X=O, NR', S) and RNu, where Nu=OH, NHR', SH, COOH, to substitute said hydrogen atoms with a protective organic layer, and wherein the reactants are purified to free them of peroxide and hydroperoxide impurities prior to said hydrosilation and the length of the carbon chains in the reactants is greater than or equal to 8.

2. A method as claimed in claim 1, wherein said reactants are aldehydes.

3. A method as claimed in claim 1, wherein said organic thermal processing is carried out in the absence of an external catalyst.

4. A method as claimed in claim 1, wherein said protective organic layer has a thickness is equal to or less than the length of the molecules of said reactants.

5. A method as claimed in claim 4, wherein said protective organic monolayer comprises bonds selected from the group consisting of: Si—C and Si—O—C.

6. A method as claimed in claim 1, wherein said organic thermal processing comprises reacting said porous silicon structure with reactants selected from the group consisting of: octyl and decyl aldehydes.

7. A method as claimed in claim 6, wherein said organic thermal processing takes place at a temperature of between 50° C. and 250° C.

8. A method as claimed in claim 7, wherein said organic thermal processing at a temperature of between 85° C. and 115° C.

9. A method as claimed in claim 8, wherein said porous silicon structure is reacted with an aldehyde at about 85° C.

10. A method as claimed in claim 1, wherein said reactants are purified prior at said thermal processing step by distillation.

11. A method as claimed in claim 10, wherein prior to thermal processing the silicon structure is rinsed with an organic solvent and then dried.

12. A method as claimed in claim 11, wherein said organic solvent is ethanol.

13. A method as claimed in claim 11, wherein said silicon structure is dried by exposure to an inert gas flow.

14. A method as claimed in claim 13, wherein said inert gas is selected from the group consisting of argon and nitrogen.

15. A method as claimed in claim 1, wherein the reactants are deoxygenated prior to thermal processing.

16. A method as claimed in claim 1, wherein a small amount of oxidation is permitted to occur during said thermal processing.

17. A method as claimed in claim 16, wherein said porous silicon structure is thermally reacted with ethyl undecylenate to produce a surface bearing an ester function at the end of an Si layer.

18. A method as claimed in claim 17, wherein said thermal processing takes place at 85° C.

19. A method of making a stabilized porous silicon (PSi) structure to protect the porous silicon structure from luminescence fatigue, comprising:
treating a silicon wafer in an aqueous acid solution to remove native oxide and produce a hydrogen-terminated surface;
electrochemically etching said hydrogen terminated surface to provide a porous silicon film;
providing an aldehyde or thioaldehyde reactant capable of producing a protective organic layer on said structure;
purifying said reactant to remove peroxide and hyperoxide impurities; and subjecting said porous silicon film to non-catalytic thermally induced hydrosilation with said reactant to substitute said hydrogen atoms in said hydrogen-terminated surface with a protective organic layer.

20. A method as claimed in claim 19 wherein said reactant is purified by distillation.

21. A method as claimed in claim 19, wherein said organic thermal processing takes place in the absence of an external catalyst.

22. A method as claimed in claim 19, wherein said porous silicon film is subjected to organic thermal processing at a temperature between 85 and 115° C.

23. A method as claimed in claim 19, wherein said protective organic layer is an organic monolayer of a thickness substantially equally to the length of molecules in said organic protective layer.

24. A method as claimed in claim 23, wherein said organic monolayer comprises Si—C and Si—O—C bonds.

25. A method as claimed in claim 19, wherein said porous silicon film is reacted with compounds selected from the group consisting of: octyl and decyl aldehydes.

* * * * *